United States Patent
Kang et al.

(10) Patent No.: US 6,197,683 B1
(45) Date of Patent: Mar. 6, 2001

(54) METHOD OF FORMING METAL NITRIDE FILM BY CHEMICAL VAPOR DEPOSITION AND METHOD OF FORMING METAL CONTACT OF SEMICONDUCTOR DEVICE USING THE SAME

(75) Inventors: Sang-bom Kang, Seoul; Chang-soo Park, Suwon; Yun-sook Chae, Seoul; Sang-in Lee, Suwon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/156,724

(22) Filed: Sep. 18, 1998

(30) Foreign Application Priority Data

Sep. 29, 1997 (KR) .................................. 97-49746
Jul. 22, 1998 (KR) .................................. 98-29531

(51) Int. Cl.$^7$ ......................... H01L 21/44; H01L 21/4763
(52) U.S. Cl. ............................ 438/643; 427/99; 438/680
(58) Field of Search ................................... 438/680, 681, 438/642, 643, 648, 652, 653; 427/99, 124, 126.1

(56) References Cited

U.S. PATENT DOCUMENTS 4,800,100 * 1/1989 Herbots et al. .
5,916,365 * 6/1999 Sherman .

* cited by examiner

*Primary Examiner*—Charles Bowers
*Assistant Examiner*—Evan Pert
(74) *Attorney, Agent, or Firm*—Marger Johnson & McCollom, P.C.

(57) ABSTRACT

A method of forming a metal nitride film using chemical vapor deposition (CVD), and a method of forming a metal contact of a semiconductor device using the same, are provided. The method of forming a metal nitride film using chemical vapor deposition (CVD) in which a metal source and a nitrogen source are used as a precursor, includes the steps of inserting a semiconductor substrate into a deposition chamber, flowing the metal source into the deposition chamber, removing the metal source remaining in the deposition chamber by cutting off the inflow of the metal source and flowing a purge gas into the deposition chamber, cutting off the purge gas and flowing the nitrogen source into the deposition chamber to react with the metal source adsorbed on the semiconductor substrate, and removing the nitrogen source remaining in the deposition chamber by cutting off the inflow of the nitrogen source and flowing the purge gas into the deposition chamber. Accordingly, the metal nitride film has low resistivity and a low content of Cl even with excellent step coverage, and it can be formed at a temperature of 500° C. or lower. Also, a deposition speed, approximately 20 Å/cycle, is suitable for mass production.

17 Claims, 13 Drawing Sheets

METHOD OF FORMING METAL NITRIDE FILM BY CHEMICAL VAPOR DEPOSITION AND METHOD OF FORMING METAL CONTACT OF SEMICONDUCTOR DEVICE USING THE SAME

BACKGROUND OF THE INVENTION

1. Field of the Invention

The present invention relates to a method of fabricating semiconductor devices, and more particularly, to a method of forming a metal nitride film by chemical vapor deposition (CVD) where a metal source and a nitrogen source are used as a precursor, and a method of forming a metal contact of a semiconductor device using the above method.

2. Description of the Related Art

A barrier metal layer, which prevents mutual diffusion or chemical reaction between different materials, is indispensable to stabilize the contact interfaces of semiconductor devices. In general, a metal nitride such as TiN, TaN or WN has been widely used as the barrier metal layer of semiconductor devices. Here, TiN is a representative example among the above metal nitrides.

However, when the metal nitride film such as TiN is fabricated by sputtering, its application to highly integrated semiconductor devices is not appropriate, due to low step coverage. For an example, FIGS. 9A and 9B show the cross-section of a via contact for connection between metal wiring. FIGS. 9A and 9B show a simple via contact and an anchor via contact, respectively. The formation processes thereof are as follows. A first metal layer 30 composed of aluminum (Al) is formed on a semiconductor substrate 20. A TiN film 40 is formed as a capping film on the resultant structure by sputtering, and then an interlayer insulative film 50 or 51 is deposited. A contact hole is formed by etching the interlayer insulative film 50 or 51 on the first metal layer 30. In FIG. 9B, the step of forming an anchor A by wet etching is added. After Ti as an adhesive layer and TiN 60 or 61 as a barrier metal layer is deposited, a tungsten (W) plug 70 or 71 is formed to fill the contact hole, by CVD. Thereafter, tungsten at the upper portion is removed by chemical mechanical polishing or etch-back, and then a second metal layer is deposited on the resultant structure, thereby completing the connection between metal wiring. However, this last step is not shown.

Here, in a conventional method, the TiN film 60 or 61, being the barrier metal layer, is deposited by sputtering, with inferior step coverage. Here, the thickness of a TiN film on the bottom, corner and anchor A of the contact hole is reduced, with an increase in the aspect ratio of the via. Accordingly, at a thin portion, Ti or Al combines with fluorine remaining in tungsten source gas $WF_6$ during tungsten deposition being a subsequent process, and thus an insulative film X forms of $TiF_x$ or $AlF_x$ leading to a contact failure.

When the contact failure is avoided by increasing the deposition time to increase the thickness of the TiN film 60 or 61, the thickness of the TiN film increases only at the upper portion of the contact hole, and the upper portion of the contact hole is narrowed or blocked. Thus, voids are likely to be generated upon subsequent tungsten deposition. A process with improved step coverage is required to apply TiN to a contact with a high aspect ratio. Accordingly, a process for fabricating a metal nitride film using CVD (hereinafter called a CVD-metal nitride film) has been developed as a next generation process.

A general process for forming a CVD-metal nitride film uses a metal source containing chlorine (Cl), e.g., a precursor such as titanium chloride $TiCl_4$. The CVD-metal nitride film using $TiCl_4$ as the precursor has a high step coverage of 95% or higher and is quickly deposited, but Cl remains in the metal nitride film as impurities. The Cl remaining as impurities in the metal nitride film causes corrosion of metal wiring such as Al and increases resistivity. Thus, the Cl content in the metal nitride film must be reduced and the resistivity must be lowered, by deposition at high temperature. That is, in the CVD-metal nitride film process using the metal source such as $TiCl_4$, a deposition temperature of at least 675° C. required to obtain resistivity of 200 $\mu\Omega$-cm or less. However, a deposition temperature of 600° C. or more exceeds thermal budget and thermal stress limits which an underlayer can withstand. In particular, when the metal nitride film is deposited on an Si contact or a via contact with an Al underlayer, a deposition temperature of 480° C. or lower is required, so that a high temperature CVD-metal nitride film process cannot be used.

A low temperature deposition CVD-metal nitride film process is possible, by adding MH (methylhydrazine, $(CH_3)HNNH_2$) to the metal source such as $TiCl_4$, but this method has a defect in that step coverage is decreased to 70% or lower.

Another method capable of low temperature deposition is to form a MOCVD-metal nitride film using a metalorganic precursor such as TDEAT (tetrakis diethylamino Ti, $Ti(N(CH_2CH_3)_2)_4$), or TDMAT (tetrakis dimethylamino Ti, $Ti(N(CH_3)_2)_4$). The MOCVD-metal nitride film has no problems due to Cl and can be deposited at low temperature. However, the MOCVD-metal nitride film contains a lot of carbon (C) as impurities, giving high resistivity, and has inferior step coverage of 70% or less.

A method of forming a metal nitride film using atomic layer epitaxy (ALE) has been tried as an alternative to deposition, in order to overcome the problems due to Cl. However, the ALE grows the metal nitride film in units of an atomic layer using only chemical adsorption, and the deposition speed (0.25 Å/cycle or less) is too slow to apply the ALE to mass production.

SUMMARY OF THE INVENTION

To solve the above problems, it is an objective of the present invention to provide a method of forming a metal nitride film, which gives excellent step coverage even at a high deposition speed and a low temperature, low impurity concentration, and low resistivity.

It is another objective of the present invention to provide a method of forming a metal contact having a barrier metal layer which has excellent step coverage even at a high deposition speed and a low temperature, low impurity concentration, and low resistivity, by applying the metal nitride film formation method to a metal contact of a semiconductor device.

Accordingly, to achieve the first objective, there is provided a method of forming a metal nitride film using chemical vapor deposition (CVD) in which a metal source and a nitrogen source are used as precursors. In this method, first, a semiconductor substrate is introduced into a deposition chamber, and the metal source flows into the deposition chamber. After a predetermined time, the flow of metal source is stopped, and a flow of purge gas is introduced into the deposition chamber. After a predetermined time, the purge gas is cut off and the nitrogen source gas flows into the deposition chamber to react with the metal source gas adsorbed on the semiconductor substrate. Again, after a predetermined time, the nitrogen source gas remaining in the deposition chamber is removed by cutting off the inflow of the nitrogen source and flowing the purge gas into the deposition chamber. Thus, the metal nitride film is formed on the semiconductor substrate.

In the metal nitride film formation method of the present invention, a gas inflow cycle of a sequence of the metal source, the purge gas, the nitrogen source, and the purge gas, can be repeated until a metal nitride film having a desired thickness is obtained.

Here, a titanium nitride film TiN can be formed by using $TiCl_4$ (titanium chloride), $TiCl_3$ (titanium chloride), $TiI_4$ (titanium iodide), $TiBr_2$ (titanium bromide), $TiF_4$ (titaniumfluoride), $(C_5H_5)_2TiCl_2$ (bis(cyclopentadienyl) titanium dichloride), $((CH_3)_5C_5)_2 TiCl_2$ (bis (pentamethylcyclopentadienyl) titanium dichloride), $C_5H_5TiCl_3$ (cyclopentadienyltitanium trichloride), $C_9H_{10}BCl_3N_6Ti$ (hydrotris (1-pyrazolylborato) trichloro titanium), $C_9H_7TiCl_3$ (indenyltitanium trichloride), $(C_5(CH_3)_5)TiCl_3$ (pentamethylcyclopentad ienyltitanium trichloride), $TiCl_4(NH_3)_2$ (tetrachlorodiaminotitanium), $(CH_3)_5C_5Ti(CH_3)_3$ (trimethylpentamethylcyclopentadienyltitanium), TDEAT or TDMAT as the metal source, and using $NH_3$ as the nitrogen source. Alternatively, a tantalum nitride film TaN can be formed using a material selected from the group consisting of $TaBr_5$ (tantalum bromide), $TaCl_5$ (tantalum chloride), $TaF_5$ (tantalum fluoride), $TaI_5$ (Tantalum iodide), and $(C_5(CH_3)_5) TaCl_4$ (pentamethylcyclopentadienyltantalum tetrachloride), as the metal source, and using $NH_3$ as the nitrogen source.

Also, it is preferable that the purge gas is an inert gas such as Ar or $N_2$.

Preferably, 1–5 sccm of the metal source flows into the deposition chamber for 1 to 10 seconds, 5–200 sccm of the nitrogen source flows thereinto for 1 to 10 seconds, and 10–200 sccm of the purge gas flows thereinto for 1 to 10 seconds.

Also, an atmospheric gas such as Ar, He and $N_2$ can be continuously introduced into the deposition chamber to maintain a constant pressure in the deposition chamber.

Meanwhile, when the TiN film is formed using TDEAT or TDMAT as the metal source, it is preferable to maintain the pressure in the deposition chamber at 0.1 to 10 torr, and the deposition temperature at between 250° C. and 400° C. When materials other than TDEAT and TDMAT are used as the metal source, the pressure in the deposition chamber is maintained at 1 to 20 torr and the deposition temperature at between 400° C. and 500° C.

To achieve the second objective, there is provided a method of forming a metal contact of a semiconductor device, wherein a first metal layer, an interlayer insulative film, a contact hole, a barrier metal layer, a metal plug, and a second metal layer are sequentially formed on a semiconductor substrate. A process for forming the barrier metal layer is as follows. A metal source flows into the semiconductor substrate having the interlayer insulative film in which the contact hole exposing the first metal layer is formed. The metal source is adsorbed to the resultant structure. After a while, the metal source remaining in the deposition chamber is removed by cutting off the inflow of the metal source and flowing a purge gas into the deposition chamber. After a predetermined time, the purge gas is cut off, and a nitrogen source flows into the deposition chamber. The nitrogen source reacts with the metal source adsorbed on the semiconductor substrate, to thus form a metal nitride film, being the barrier metal layer, on the exposed first metal layer and the contact hole. Again, after a while, the nitrogen source remaining in the deposition chamber is removed by cutting off the inflow of the nitrogen source and flowing the purge gas into the deposition chamber.

The barrier metal layer formation process can be repeated until a barrier metal layer having a desired thickness is obtained.

Here, a titanium nitride film TiN as the barrier metal layer is formed by using a material selected from the group consisting of $TiCl_4$, $TiCl_3$, $TiI_4$, $TiBr_2$, $TiF_4$, $(C_5H_5)_2TiCl_2$, $((CH_3)_5C_5)_2TiCl_2$, $C_5H_5TiCl_3$, $C_9H_{10}BCl_3N_6Ti$, $C_9H_7TiCl_3$, $(C_5CH_3)_5)TiCl_3$, $TiCl_4(NH_3)_2$, $(CH_3)_5C_5Ti(CH_3)_3$, TDEAT and TDMAT as the metal source, and using $NH_3$ as the nitrogen source. Alternatively, a tantalum nitride film TiN as the barrier metal layer is formed using a material selected from the group consisting of $TaBr_5$, $TaCl_5$, $TaF_5$, $TaI_5$, and $C_5(CH_3)_5)TaCl_4$ as the metal source, and $NH_3$ as the nitrogen source.

Also, it is preferable that the purge gas is an inert gas such as Ar or $N_2$.

The flow amounts and flow times of the metal source, nitrogen source, and purge gas flowing into a deposition chamber are within the same ranges as in the above-mentioned method of forming the metal nitride film.

Also, in order to maintain a pressure within the deposition chamber while forming a barrier metal layer, the pressure within the deposition chamber is kept at about 0.1 to 10 torr when TDEAT or TDMAT is used as the metal source, and about 1 to 20 torr when materials other than TDEAT and TDMAT are used as the metal source. The constant pressure is maintained by using an atmospheric gas such as Ar, He, or $N_2$.

It is preferable that a deposition temperature upon the formation of the barrier metal layer is about between 250° C. and 400° C. when TDEAT or TDMAT is used as the metal source, and between 400° C. and 500° C. when materials other than TDEAT and TDMAT are used as the metal source.

According to the present invention, a metal nitride film having low resistivity of 200 $\mu\Omega$-cm or less and a low content of Cl can be obtained even with excellent step coverage. Also, a CVD-metal nitride film can be formed at a temperature of 500° C. or less even at a deposition speed of about 20 Å/cycle, so that the deposition speed of the present invention is higher than that of a metal nitride film formation method using ALE having a growth speed of 0.25 Å/cycle.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
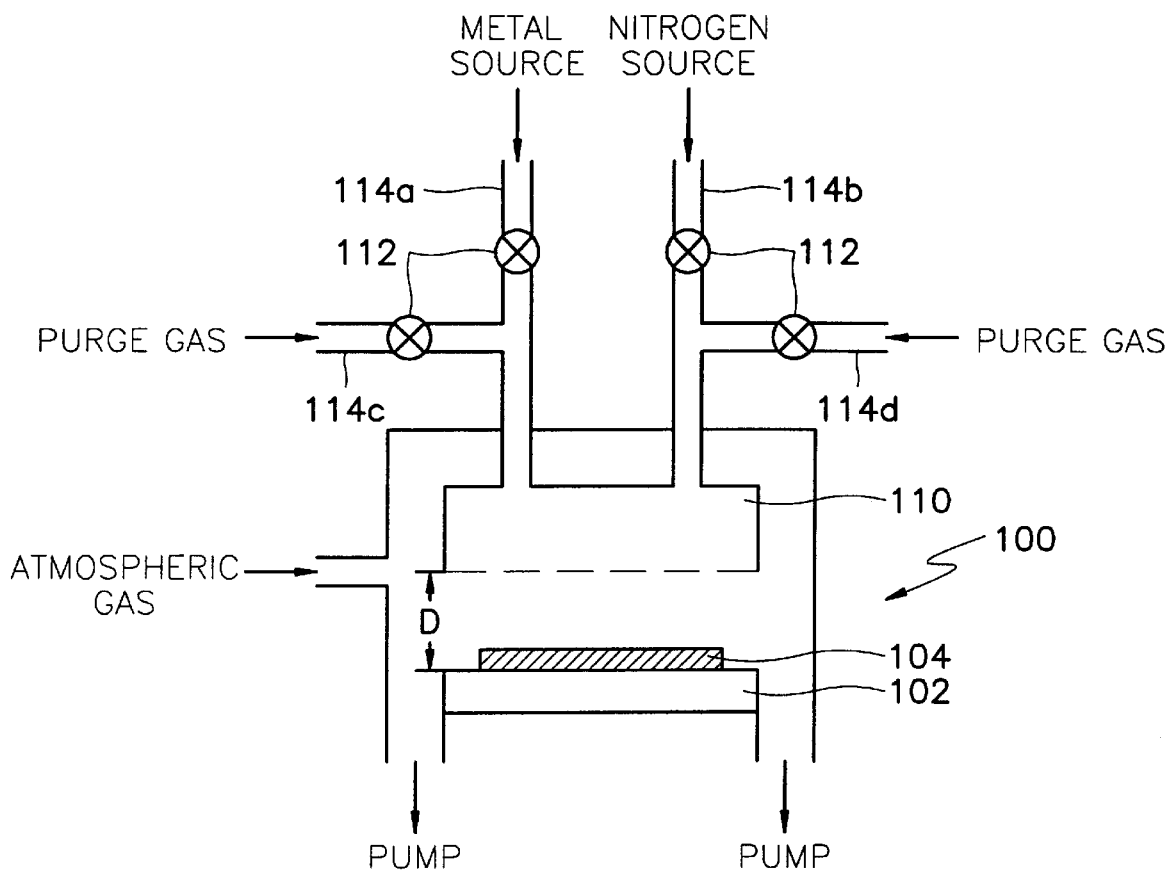
FIG. 1 shows a deposition chamber of a chemical vapor deposition (CVD) apparatus for depositing a metal nitride film on a semiconductor substrate, according to the present invention.

Referring to FIG. 1, a plurality of gas lines 114a and 114b for introducing reaction gases into a deposition chamber 100 are installed into the deposition chamber 100. Here, the number of gas lines depends on the number of metal sources and nitrogen sources, i.e., the number of reaction gases, flowed into the deposition chamber 100. In an embodiment of the present invention, two gas lines 114a and 114b are installed.

The two gas lines 114a and 114b have one end connected to a supply source (not shown) for a metal source and to a supply source (not shown) for a nitrogen source, respectively. When a TiN film is deposited on a semiconductor substrate 104, $TiCl_4$ is used as the metal source and $NH_3$ is used as the nitrogen source. Meanwhile, the other ends of the gas lines 114a and 114b are connected to a shower head 110 isolated by a predetermined distance (D of FIG. 1) from the semiconductor substrate 104 seated in the deposition chamber 100. Accordingly, the reaction gases from the gas supply sources (not shown) enter the deposition chamber 100 via the gas lines 114a and 114b and the shower head 110 connected to the ends of the gas lines 114a and 114b. The reaction gases react with each other in the deposition chamber, and the resultant forms a film on the semiconductor substrate 104.

It is preferable that the shower head 110 is a multi-port shower head which allows the reaction gases to enter the deposition chamber 100 in an unmixed state. In this embodiment, a two-port shower head is used. Also, it is preferable that the gas lines 114a and 114b are provided with purge gas supply lines 114c and 114d to supply a purge gas to the deposition chamber 100 for exhausting residual gases after reaction.

Valves 112 are installed on the respective gas supply lines. According to the on/off state of the valves 112, the purge gases or reaction gases may enter into the deposition chamber 100 or be cut off. It is preferable that the valves 112, such as pneumatic valves, are controlled by a programmed control unit to be periodically turned on or off. Reference numeral 102 is a heater for heating the semiconductor substrate 104.

A method of depositing a metal nitride such as TiN on a semiconductor substrate seated in the deposition chamber of a CVD apparatus having such a configuration, according to the present invention, will now be described in detail referring to FIGS. 1 and 2.

First, the semiconductor substrate 104 is introduced into the deposition chamber 100. The semiconductor substrate 104 may have devices such as transistors formed on its surface (see FIG. 1).

A metal source such as $TiCl_4$ flows into the deposition chamber 100 for the time of $t_s$ via the metal source supply line 114a. Alternatively, the metal source can be mixed with a carrier gas such as Ar or $N_2$ to provide a smooth gas flow into the deposition chamber 100. At this time, valves other than the valve of the gas supply line 114a for supplying a metal source are in off state. Accordingly, only the metal source such as $TiCl_4$ flows into the deposition chamber 100. At this time, a part of the entering metal source is chemically and physically adsorbed on the surface of the substrate 104, and the residual remains in the deposition chamber 100. As described above, only one type of gas enters the deposition chamber 100 for a predetermined time, instead of simultaneously flowing reaction gases into the deposition chamber 100. This is called gas pulsing (see FIG. 2).

Figure 2:
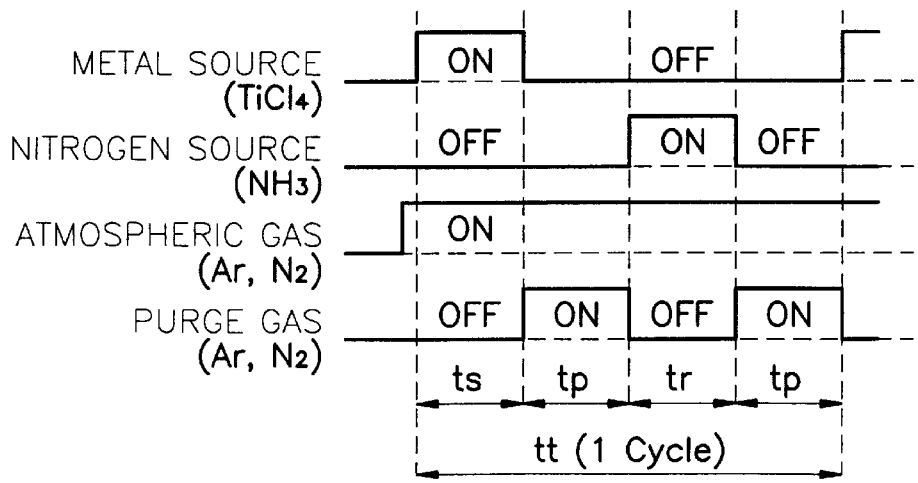
FIG. 2 shows gas inflow timings for depositing a metal nitride film on a semiconductor substrate, according to the present invention.

When inflow of the metal source into the deposition chamber 100 is completed, the valve of the gas supply line 114a for introducing the metal source is closed, and then the valve of the purge gas supply line 114c is opened to introduce the purge gas such as Ar or $N_2$ into the deposition chamber 100 for the time of $t_p$, thereby exhausting $TiCl_4$ gases from the shower head 110 and the deposition chamber 100 (in the purge gas pulsing step of FIG. 2). At this time, the flow of the purge gas and the pressure of the deposition chamber are appropriately controlled to prevent the metal source chemically and physically adsorbed into the semiconductor substrate from being separated and exhausted, thereby exhausting only the source gas remaining within the deposition chamber.

Then, the valve of the purge gas supply line 114c is closed, and the valve of the nitrogen gas source supply line 114b is opened to introduce a nitrogen gas such as $NH_3$ into the deposition chamber 100 for a time $t_r$. The nitrogen gas reacts with the metal source such as $TiCl_4$ chemically and physically adsorbed into the substrate 104, thus forming the metal nitride such as TiN on the semiconductor substrate 104. That is, because of the purge gas pulsing step before the nitrogen source such as $NH_3$ enters into the deposition chamber 100, the metal source such as $TiCl_4$ remaining in the deposition chamber 100 is exhausted via the pump (see FIG. 1). Accordingly, the nitrogen source such as $NH_3$ does not react with the metal source within the deposition chamber 100, except for on the semiconductor substrate 104. Thus, the metal nitride is formed on only the semiconductor substrate 104 into which $TiCl_4$ and $NH_3$ are adsorbed (in the $NH_3$ pulsing step of FIG. 2).

At this time, the carrier gas such as Ar or $N_2$ can be mixed with the nitrogen gas such as $NH_3$ for a smooth gas flow into the deposition chamber 100.

In a conventional method of forming a metal nitride film using ALE, only the chemically-adsorbed source remains, after purging the source physically adsorbed on the substrate. On the other hand, in the metal nitride film formation method of the present invention, the sources both physically and chemically adsorbed on the substrate remain and react. This is the fundamental difference between the prior art and the present invention.

Next, the residual nitrogen source remaining within the deposition chamber 100 after the reaction with the metal source is exhausted by another purge gas pulsing step (in the purge gas pulsing step of FIG. 2).

Meanwhile, the pressure in the deposition chamber 100 is controlled during the above-described steps. It is preferable that an atmospheric gas such as Ar or $N_2$ is continuously supplied into the deposition chamber 100.

As described above, in the method of forming a metal nitride film using gas pulsing, according to the present invention, the metal nitride film such as TiN having a predetermined thickness is deposited through a cycle having a sequence of the $TiCl_4$ pulsing step, the purge gas pulsing step, the $NH_3$ pulsing step, and the purge gas pulsing step. Here, a deposition speed is about 20 Å/cycle, and when this cycle is repeated, the thickness of a thin film is proportionally increased, so that a thin film having a desired thickness can be deposited on the semiconductor substrate 100. Here, the thickness of the metal nitride film deposited for one cycle is determined by the flow amounts of the metal source and nitrogen source entering the deposition chamber 100, the gas pulsing times, the flow amount of the purge gas, and the purge time.

Hereinafter, experimental examples of forming a TiN film according to the present invention will be described.

First experimental example

A TiN film is deposited by the cycles comprising the gas pulsing steps, under the following reaction conditions, on the semiconductor substrate 104 which is maintained at a temperature of 500° C. or lower by the heater 102 of FIG. 1.

Figure 3:
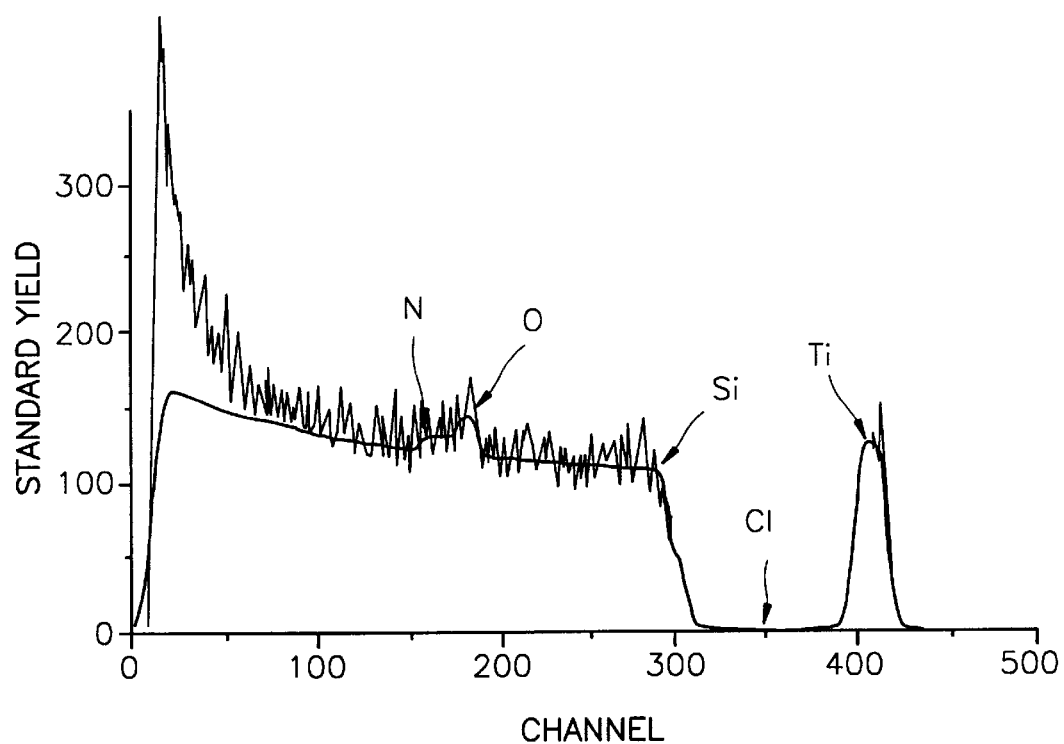
FIG. 3 is a graph of the results of Rutherford back scattering (RBS) of a metal nitride film deposited according to the present invention.

Deposition conditions object material: TiN atmospheric gas: Ar pressure in deposition chamber: 1–2Torr metal source, nitrogen source: $TiCl_4$, $NH_3$ flow amount of $TiCl_4$, pulsing time ($t_s$) of $TiCl_4$: 1–5 sccm, 5 sec flow amount of $NH_3$, pulsing time ($t_r$) of $NH_3$: 5–30 sccm, 5 sec purge gas, flow amount of purge gas, purge time ($t_p$): Ar, 10–100 sccm, 10 sec carrier gas, flow amount of carrier gas: Ar, 10–100 sccm time ($t_t$) for one cycle: 30 sec FIG. 3 shows the results of checking the state of the TiN thin film deposited on the semiconductor substrate 104 under the aforementioned conditions using an RBS method. In FIG. 3, a horizontal axis indicates channels in a multi-channel analyzer (MCA), and a vertical axis indicates the standardized yields of elements detected by the MCA. Here, each channel has a relationship of E=4.05 channel+59.4 with an energy E in eV.

The TiN film deposited on the semiconductor substrate 104 under the aforementioned conditions has a unique gold color, and has a perfect composition of Ti:N=1:1 as shown in FIG. 3. Cl is 0.3% or less of the total elements contained in the TiN thin film, which is the detection limit by RBS, as shown in FIG. 3. Also, the resistivity of the TiN film deposited on the semiconductor substrate 104 under the above conditions was measured as a low value of about 130 $\mu\Omega$-cm. Meanwhile, according to several experiments, it was verified that the thickness of the TiN thin film deposited for each cycle preferably is 20 Å or less to provide such an excellent thin film property.

Figure 4:
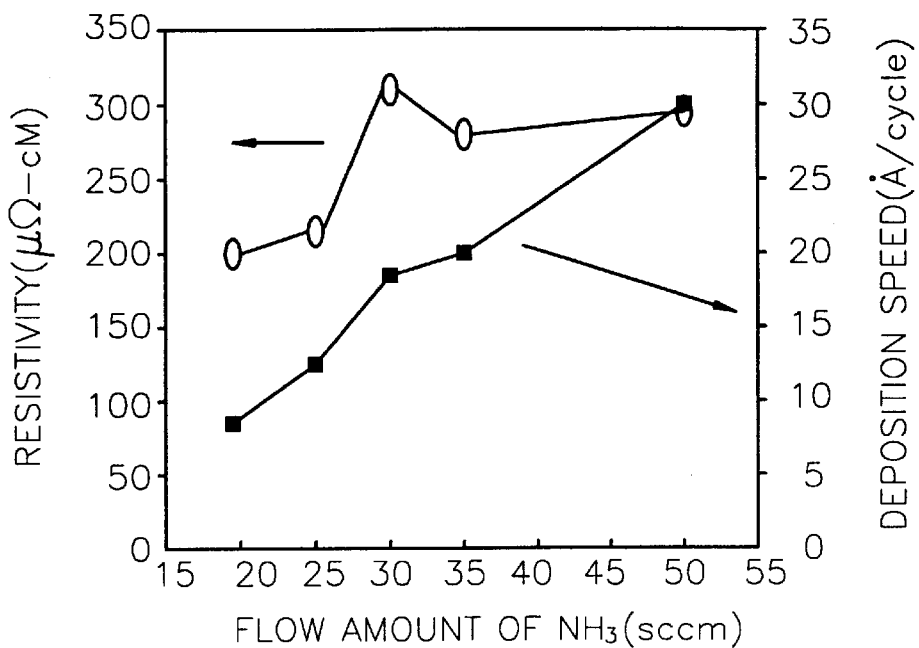
FIG. 4 is a graph illustrating the resistivity and deposition speed of a metal nitride film with respect to flow amount of $NH_3$, when the metal nitride film is deposited according to the present invention.
Figure 5:
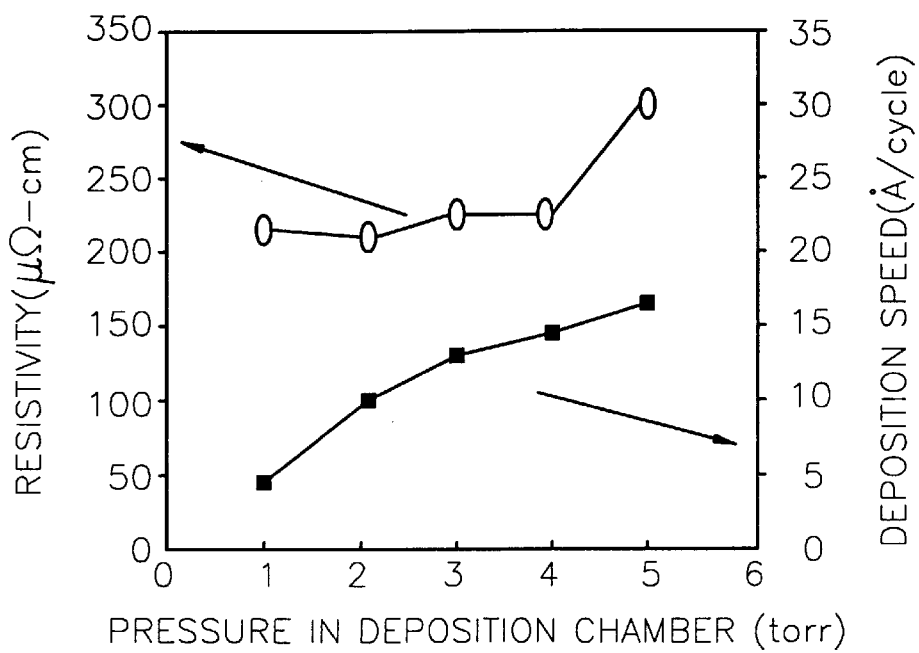
FIG. 5 is a graph illustrating the resistivity and deposition speed of a metal nitride film with respect to pressure in a deposition chamber, when the metal nitride film is deposited according to the present invention.

FIGS. 4 and 5 show the resistivity and deposition speed of the TiN film deposited according to the present invention, at various flow amounts of the nitrogen source $NH_3$ and pressures in the deposition chamber, respectively. As shown in FIGS. 4 and 5, the deposition speed increases with an increase in the flow amount of $NH_3$ and the pressure in the deposition chamber, and thus the resistivity also increases. Accordingly, it is preferable that the conditions for deposition are set in consideration of the thickness and the deposition speed and resistivity of the metal nitride film required according to places to apply the metal nitride film.

Second experimental example

A deposition speed for each cycle, the thickness and deposition speed of a TiN film deposited according to an increase in the number of cycles, and resistivity according to a change in deposition temperature, are measured under four deposition conditions as shown in the following Table 1. Here, the metal source is $TiCl_4$, the nitrogen source is $NH_3$, and the purge gas is Ar.

TABLE 1

| deposition conditions | amount and time of material source | amount and time of purge gas | amount and time of nitrogen source | amount and time of purge gas | pressure | amount of atmospheric gas |
|---|---|---|---|---|---|---|
| TiN 00 | 5 sccm, 5 sec | 40 sccm, 5 sec | 150 sccm, 5 sec | 40 sccm, 5 sec | 3 torr | 50 sccm |
| TiN 01 | 3 sccm, 3 sec | 150 sccm, 3 sec | 30 sccm, 3 sec | 150 sccm, 3 sec | 2 torr | 30 sccm |
| TiN 02 | 3 sccm, 2 sec | 150 sccm, 2 sec | 50 sccm, 2 sec | 150 sccm, 2 sec | 3 torr | 30 sccm |
| TiN 03 | 3 sccm, 2 sec | 150 sccm, 2 sec | 100 sccm, 2 sec | 150 sccm, 2 sec | 3 torr | 30 sccm |

Deposition speeds per cycle under the above deposition conditions are as follows:

TiN 00: 20 Å/cycle (60 Å/min, since one cycle is 20 seconds)

TiN 01: 2 Å/cycle (10 Å/min, since one cycle is 12 seconds)

TiN 02: 3.5 Å/cycle (26.3 Å/min, since one cycle is 8 seconds)

TiN 03: 6 Å/cycle (45 Å/min, since one cycle is 8 seconds).

Figure 6:
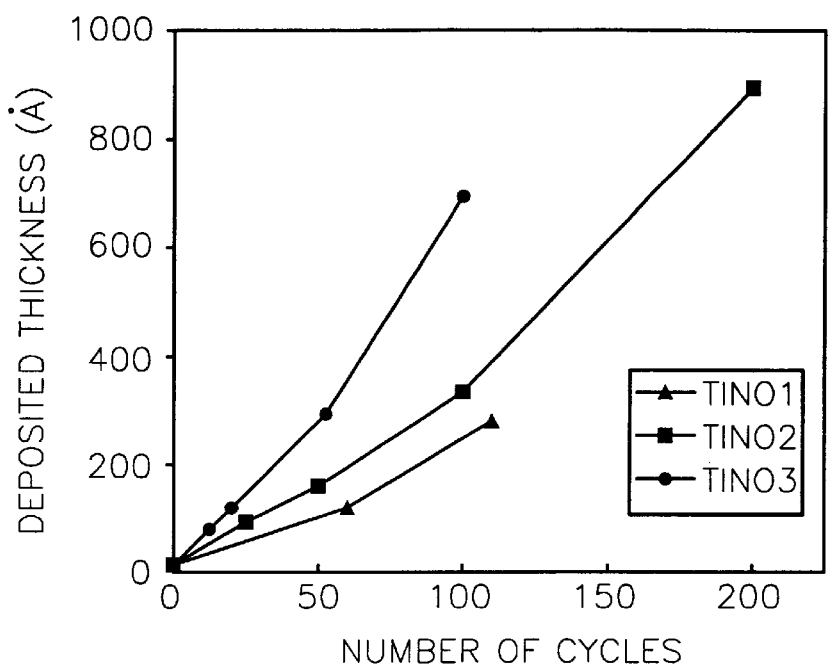
FIG. 6 is a graph illustrating the deposited thickness of a metal nitride film versus the number of cycles when the metal nitride film is deposited according to the present invention.
Figure 7:
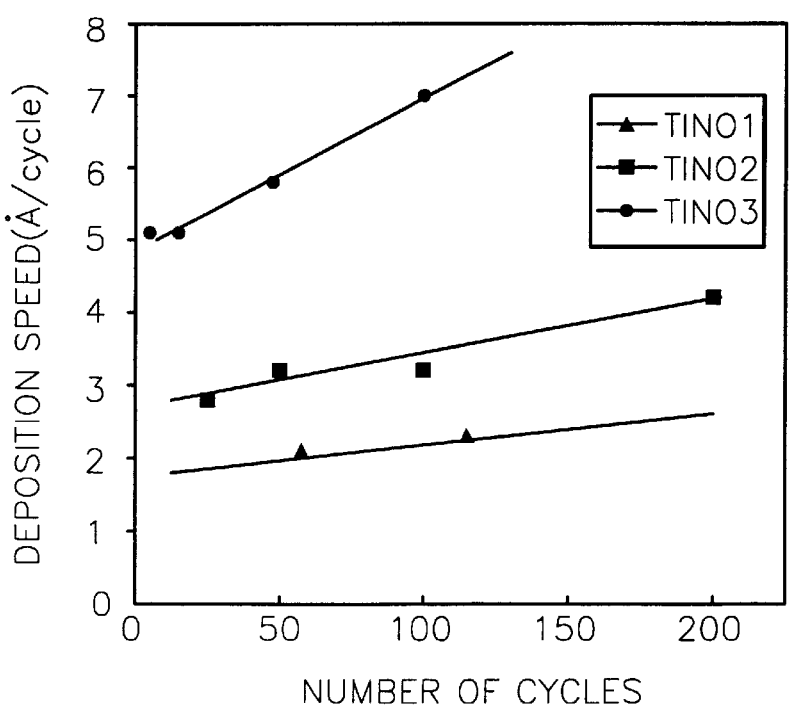
FIG. 7 is a graph illustrating the deposition speed of a metal nitride film versus the number of cycles when the metal nitride film is deposited according to the present invention.

FIGS. 6 and 7 show the deposition thickness and deposition speed, respectively, according to an increase in the number of cycles. Here, a deposition temperature is 500° C. As can be seen from FIGS. 6 and 7, the deposition speed increases slowly with an increase in the number of cycles, and the deposition thickness increases in proportion to the number of cycles. Thus, the thickness of the TiN film to be deposited can be controlled by adjusting the number of cycles under consistent deposition conditions.

Figure 8:
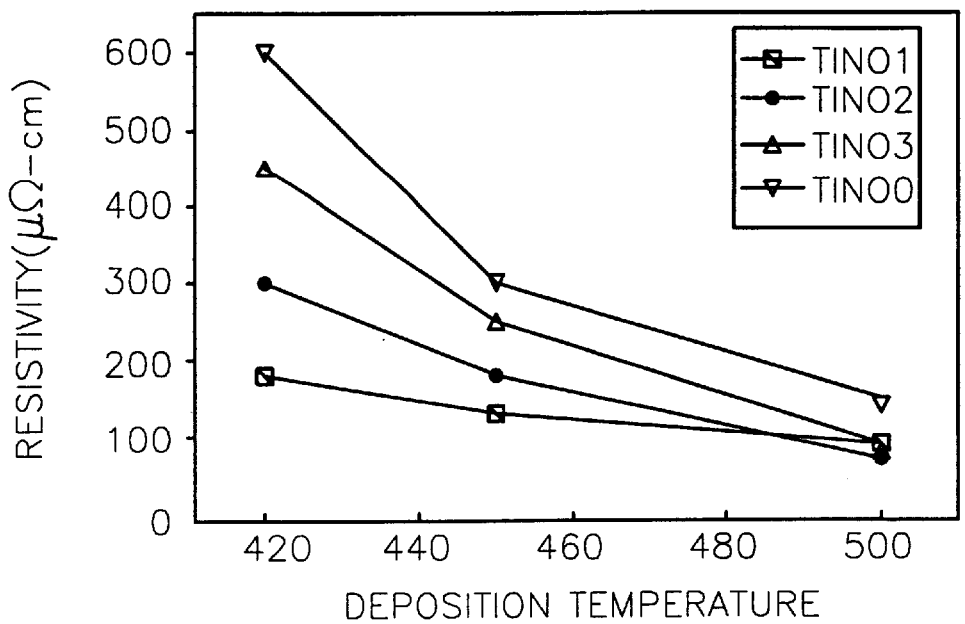
FIG. 8 is a graph illustrating the resistivity of a metal nitride film versus deposition temperature when the metal nitride film is deposited according to the present invention.

FIG. 8 is a graph showing resistivity of the TiN film with respect to deposition temperature according to the four deposition conditions described above. It can be seen from FIG. 8 that the resistivity decreases with an increase in the deposition temperature. Particularly, it can be seen that the resistivity sharply decreases under the deposition condition (TiN 00) in which the deposition speed is high. Also, we can recognize that resistivity of 200 $\mu\Omega$-cm or less obtained at about 500° C. under all the four deposition conditions.

An example of applying the metal nitride film formation method of the present invention to a via contact will now be described in detail, referring to FIGS. 10A through 11F. However, it is apparent to those skilled in the art that the metal nitride film formation method of the present invention is applicable not only to a via contact but also to a metal contact on any substrate. In this case, the process conditions can be changed.

Figure 10A:
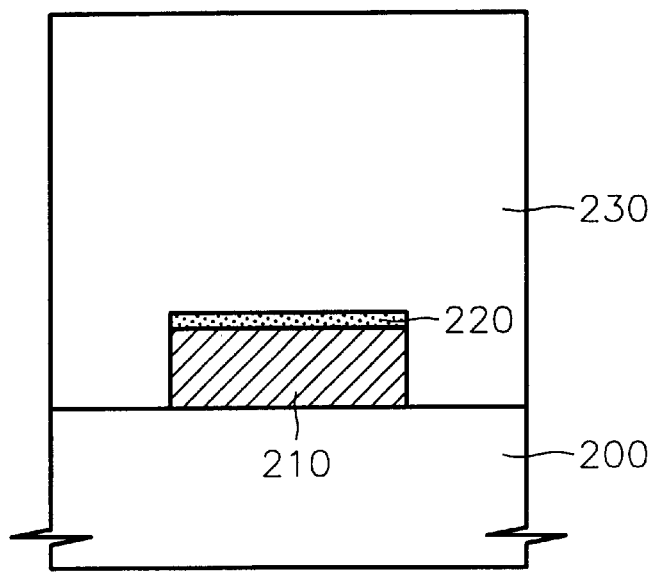
FIGS. 10A through 10F are cross-sectional views illustrating an example of a process for forming a via contact using the metal nitride film formation method of the present invention.
Figure 10B:
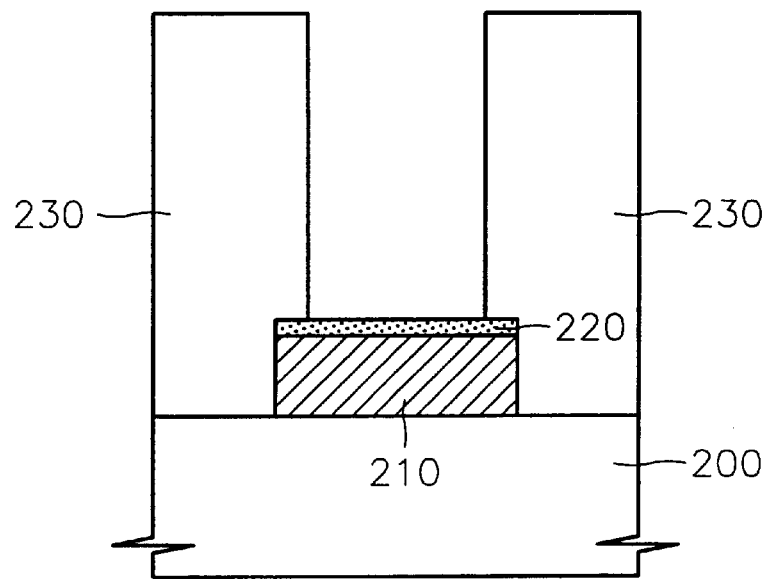

First, a first metal layer 210 such as Al is formed on a semiconductor substrate 200, and a TiN film 220 is deposited as a capping film on the resultant structure, as shown in FIG. 10A. The TiN film 220 can be deposited by sputtering. Then, an interlayer insulative film 230 is deposited, and a portion on which a via is to be formed is etched, thereby forming the structure of FIG. 10B. An adhesive layer such as a thin Ti film is formed on the resultant structure to improve adhesion of the Tin film, before the TiN film, being a barrier metal layer, is deposited. This Ti film can also be formed by sputtering.

Figure 10C:
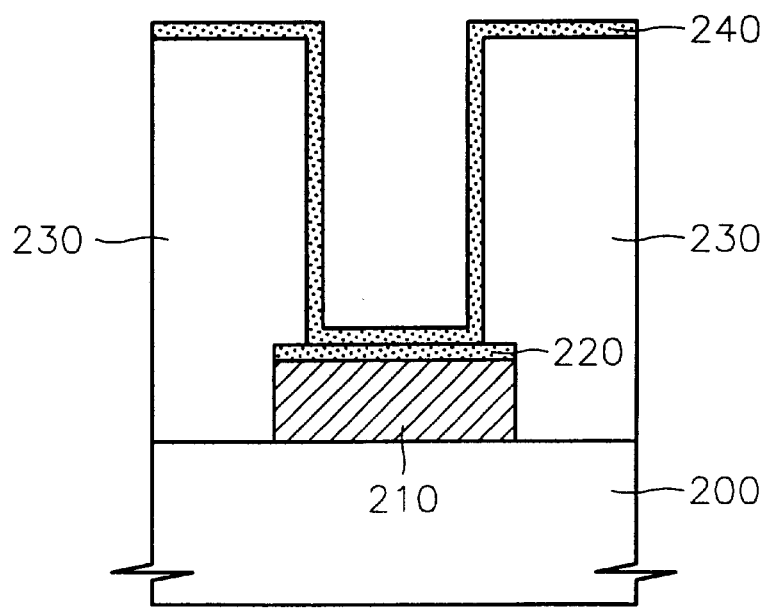

Next, the TiN film 240, being a barrier metal layer, is deposited by the metal nitride film formation method of the present invention, thus forming the structure of FIG. 10C. That is, as described above, a metal source, a purge gas, and a nitrogen source flow into the deposition apparatus of FIG. 1 in the sequence of the metal source, the purge gas, the nitrogen source, and the purge gas. This is repeated until a desired thickness is obtained. Here, the metal source is $TiCl_4$ and the nitrogen source is $NH_3$. The amounts of the metal source, the nitrogen source and the purge gas are 1 to 5 sccm, 5 to 200 sccm, and 10 to 200 sccm, respectively, and the inflow times thereof are about 1 to 10 seconds. A deposition temperature is 480° C. or lower, and the pressure in the deposition chamber is between 1 torr and 20 torr. If necessary, an atmospheric gas such as Ar, He, or $N_2$, and a carrier gas of Ar, $N_2$, etc., can be used. These deposition conditions are appropriately controlled considering the deposition apparatus, the deposition speed, the thickness of the TiN film deposited, and the resistivity of the TiN film.

Figure 10D:
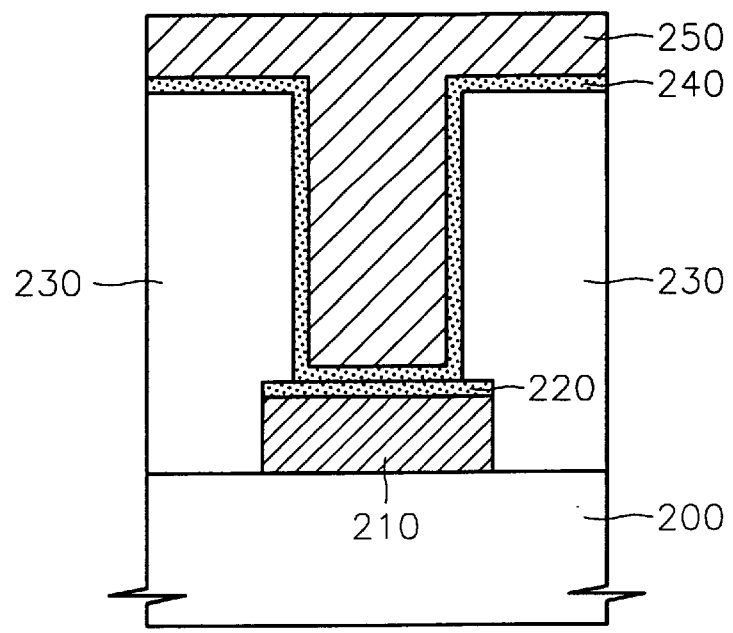
Figure 10E:
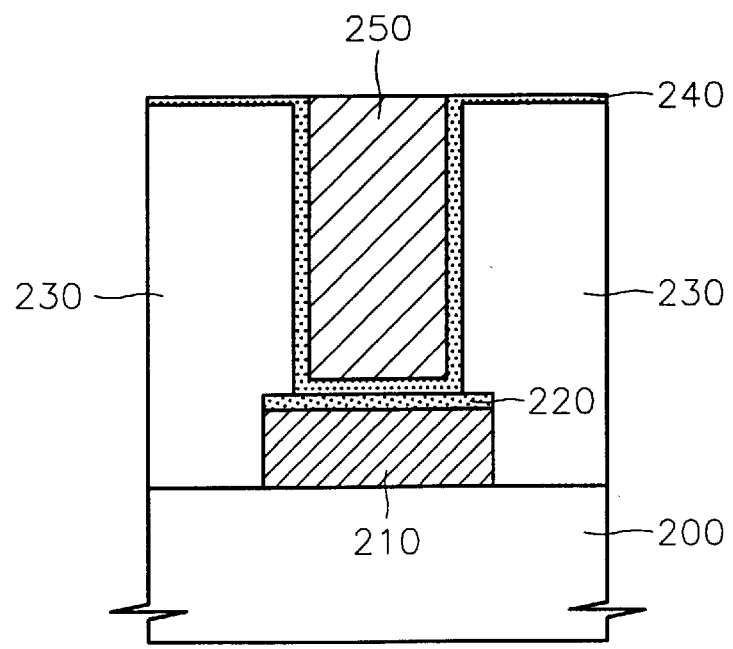
Figure 10F:
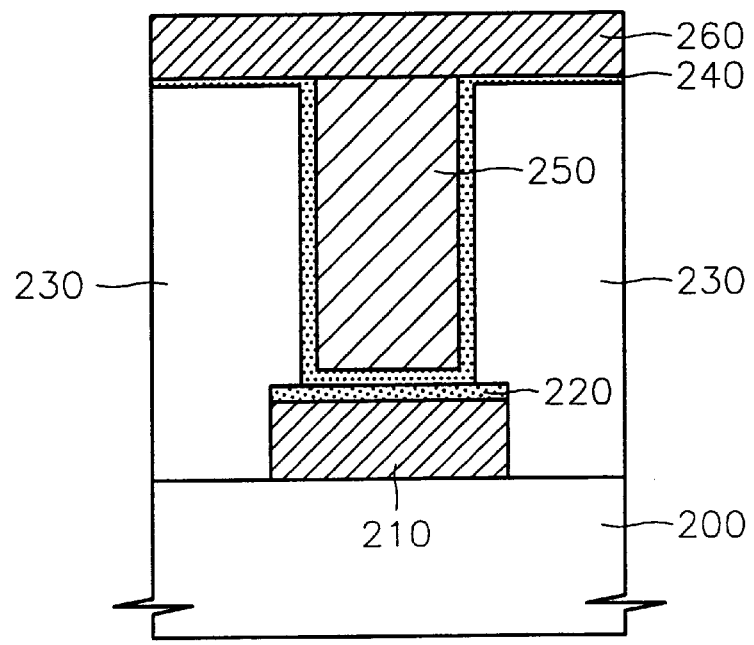

A metal plug 250 such as W is formed by a typical method, in FIG. 10D, and a metal deposited on the upper surface of an interlayer insulative film 230 is removed by chemical mechanical polishing or etch back, in FIG. 10E. Then, when a second metal layer 260 is formed on the resultant structure as shown in FIG. 10F, interconnection between metal layers is accomplished.

Figure 11A:
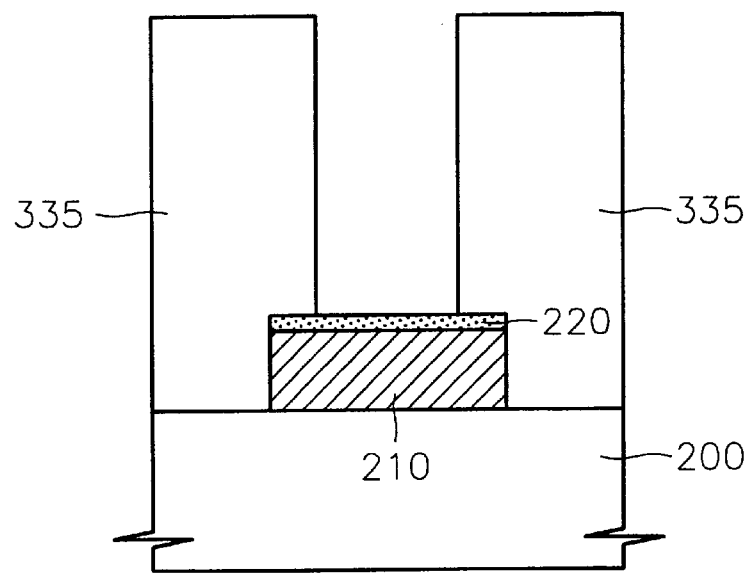
FIGS. 11A through 11F are cross-sectional views illustrating another example of a process for forming a via contact using the metal nitride film formation method of the present invention.
Figure 11B:
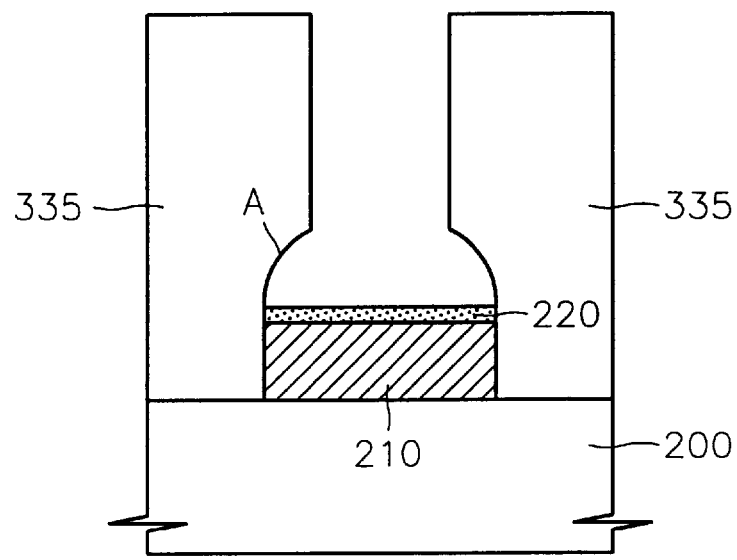
Figure 11C:
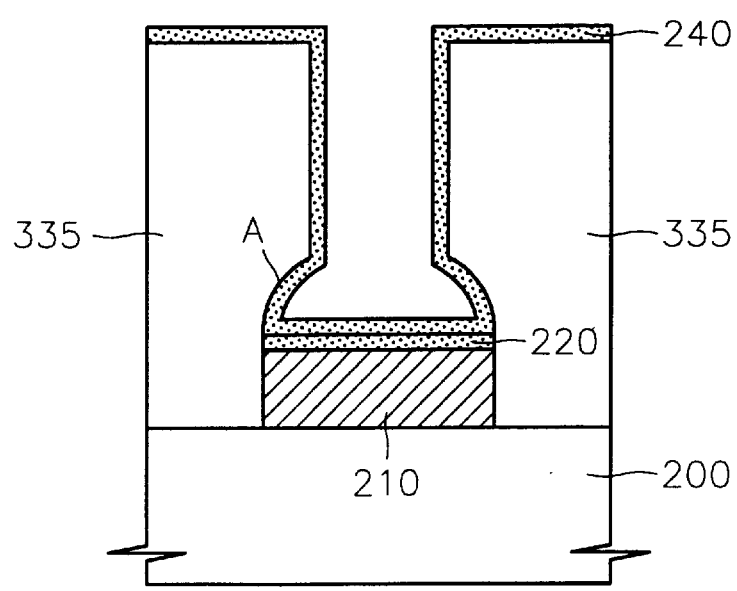
Figure 11D:
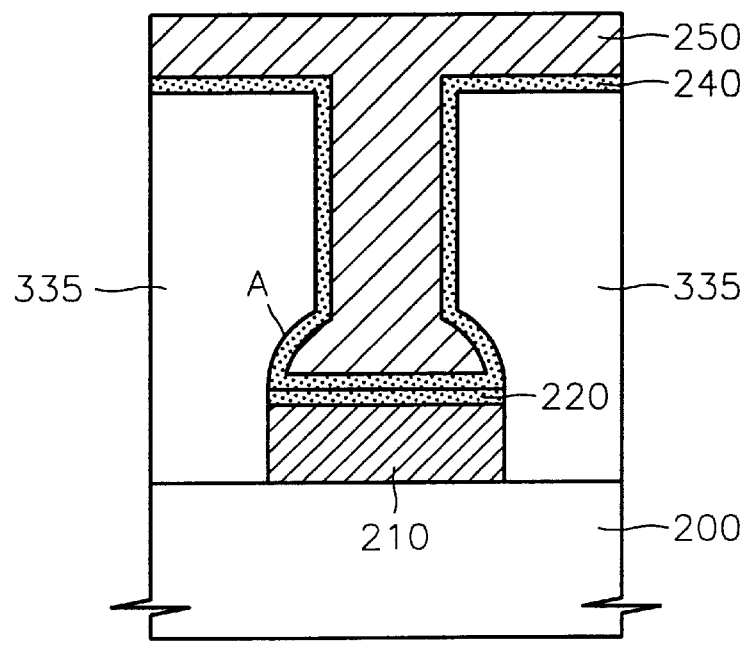
Figure 11E:
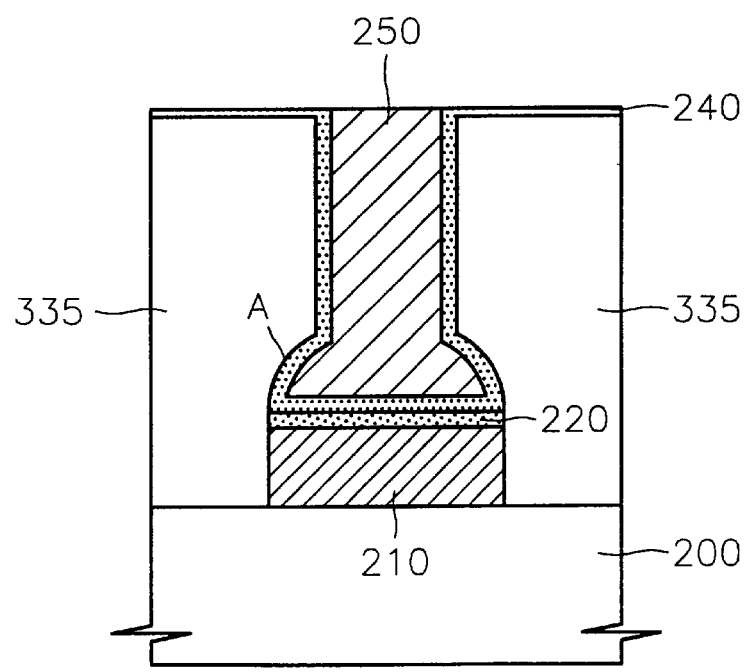
Figure 11F:
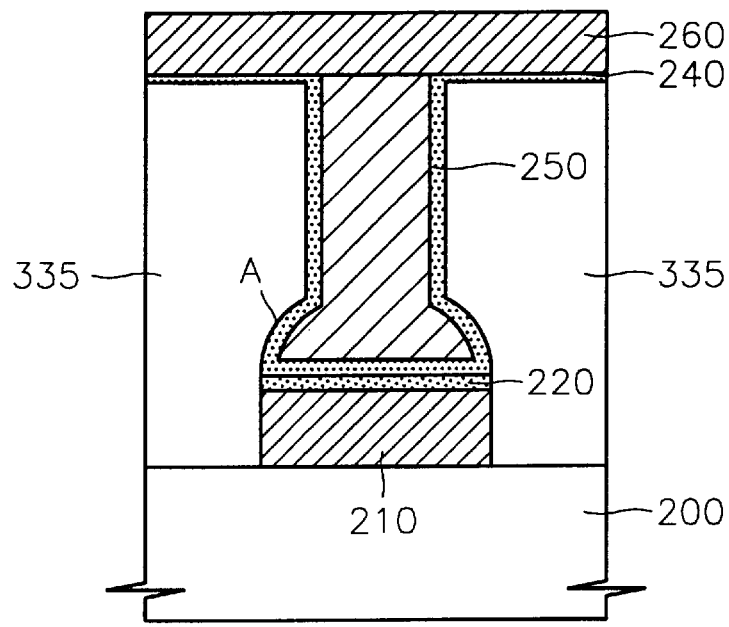

FIGS. 11A through 11F are cross-sectional views illustrating a process for forming an anchor via contact, which is fundamentally the same as the process of FIGS. 10A through 10F except that an anchor A is formed on the lower portion of a contact hole to lower resistance by increasing a contact area as shown in FIG. 11B. In a chemical mechanical polishing or etch back process, the TiN film 340 functions as a stopping layer. The anchor A is formed by wet etching the interlayer insulative film 335 after forming the contact hole as shown in FIG. 11A. The other steps are the same as those of FIGS. 10A through 10F, so they will not be described again.

Figure 9A:
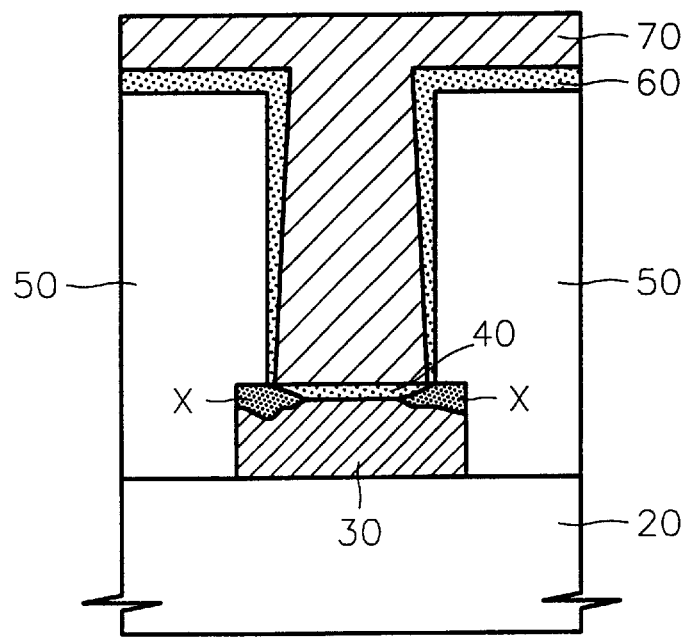
FIGS. 9A and 9B are cross-sections of a via contact formed by a conventional method.
Figure 9B:
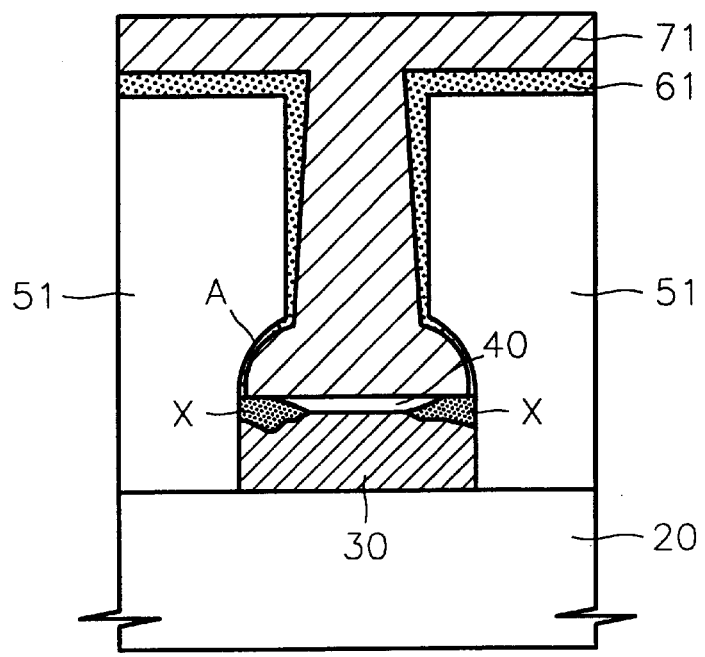

As described above, when the metal nitride film formation method of the present invention is applied to the via contact, a barrier metal layer having an excellent step coverage can be obtained at low temperature. Thus, a contact failure X such as TiFx or AlFx shown in FIGS. 9A and 9B can be prevented.

Third experimental example

A Ti film is deposited to a thickness of 100 Å on contact holes of various different widths, by sputtering. Then, as a barrier metal layer, a TiN film according to the present invention, and a collimated TiN film formed by sputtering by a conventional method, are deposited to different thicknesses, and a plug is formed of CVD-W. The third experiment measures via resistance in this case. Here, the deposition conditions of the TiN film according to the present invention are equal to the deposition conditions of TiN 00 of the aforementioned second experiment, with a deposition temperature of 450° C.

Via widths: 0.24 $\mu$m, 0.32 m, 0.39 $\mu$m (via depth: 0.9 $\mu$m)

Thickness of TiN film: 100 Å, 200 Å, 400 Å, 600 Å (these are deposited by the method of the present invention), 700 Å (collimated TiN film)

Figure 12:
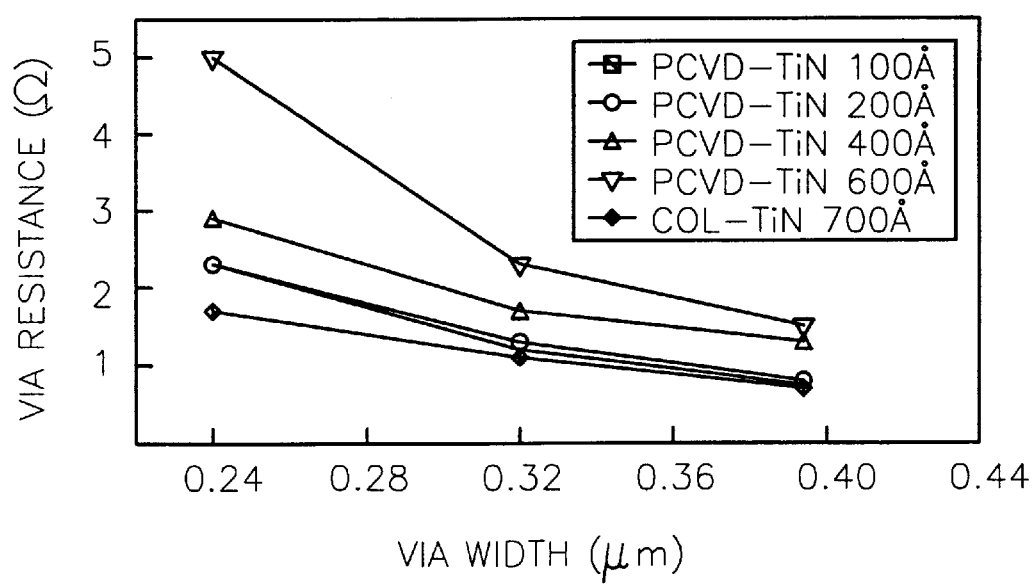
FIG. 12 is a graph illustrating the relationship between via resistivity and via width when a barrier metal layer is formed according to the present invention and the prior art.

As the results of measurement, resistivity generally decreases with an increase in via width as shown in FIG. 12, and resistivity decreases with decreasing the thickness of the TiN film of the present invention. The 100 Å-thick TiN film according to the present invention has a similar resistance to the collimated TiN film (COL-TiN). In particular, when the via width is 0.39 Φm, the above five TiN films have similar via resistances. Meanwhile, in the second experiment and as shown in FIG. 8, the TiN films of the present invention were formed at a high deposition speed per cycle (20 Å/cycle) and with large resistivity (300 $\mu\Omega$-cm at 450° C.). Accordingly, if the TiN films of the present invention are formed at a lower deposition speed and with smaller resistivity, their via resistances can be significantly improved.

Figure 13:
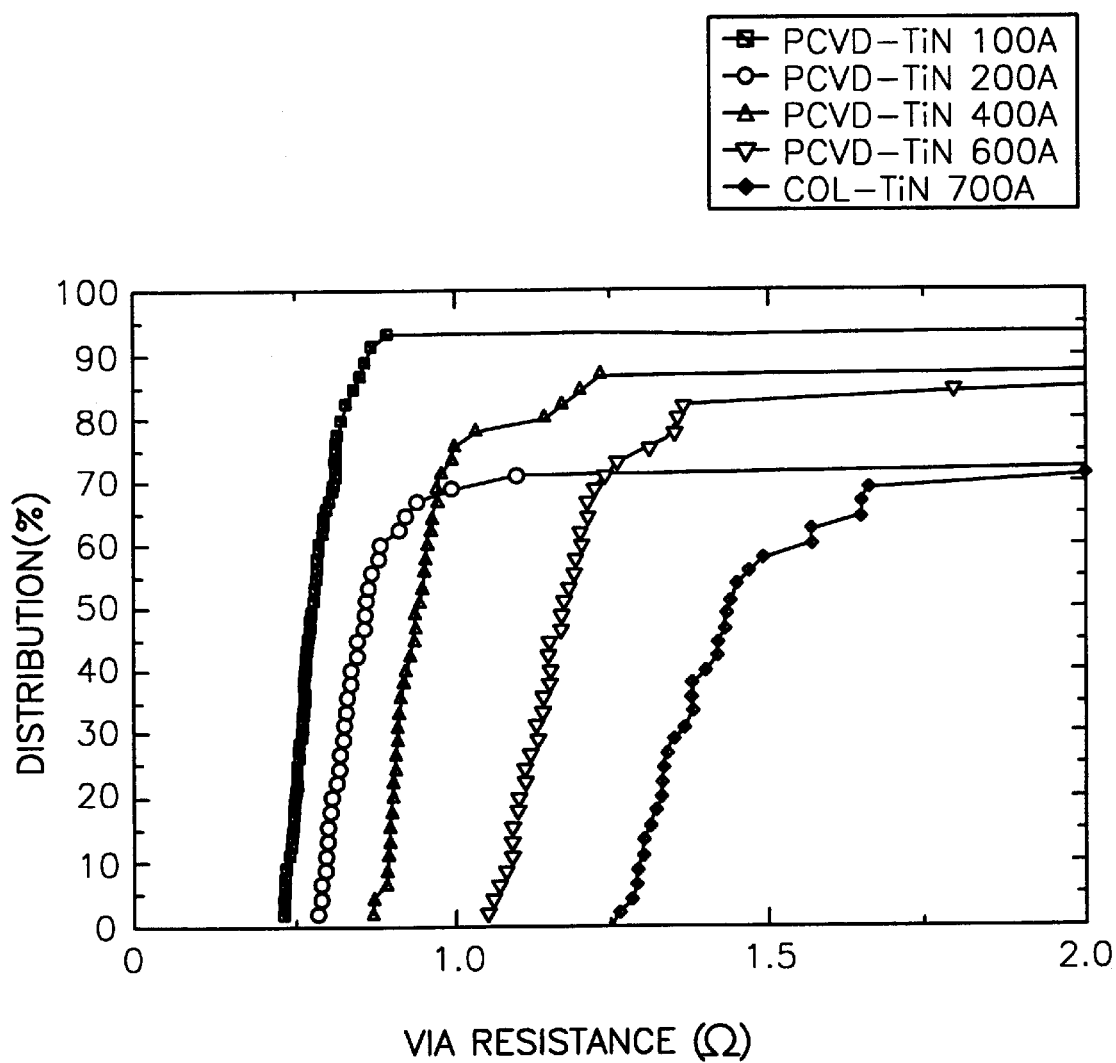
FIG. 13 is a graph illustrating via resistivity distributions when barrier metal layers are formed according to the present invention and the prior art.

FIG. 13 is a graph showing the distribution of the via resistance of each TiN film when the via width is 0.39 $\mu$m. From the graph of FIG. 13, we can recognize that the collimated TiN film (COL-TiN) and the TiN films according to the present invention are evenly distributed, without a big difference, around 1.0 $\Omega$.

Up to now, the present invention has been described by taking as an example the method wherein the TiN film is formed as a metal nitride film by using $TiCl_4$ and $NH_3$ as a precursor. However, the present invention can be applied to a TiN film using $TICl_3$, $TiI_4$, $TiBr_2$, $TiF_4$, $(C_5H_5)_2TiCl_2$, $((CH_3)_5C_5)_2TiCl_2$, $C_5H_5TiCl_3$, $C_9H_{10}BCl_3N_6Ti$, $C_9H_7TiCl_3$, $(C_5(CH_3)_5)TiCl_3$, $TiCl_4(NH_3)_2$, $(CH_3)_5C_5Ti(CH_3)_3$, TDEAT or TDMAT instead of $TiCl_4$ as the precursor, and also to other metal nitride films such as TaN firm using $TaBr_5$, TaCl$_5$, TaF$_5$, TaI$_5$, or (C$_5$(CH$_3$)$_5$)TaCl$_4$ as precursors, and further to almost any material layers deposited using CVD.

However, when the TiN film is formed using TDEAT or TDMAT as the precursor, it is preferable that a deposition temperature is between 250° C. and 400° C. and a pressure is about 0.1 to 10 torr, in contrast with the cases using the other materials as the precursor. Since the above precursors for forming the TaN film are all solid, a solid bubbler must be used to form a source gas.

According to the metal nitride film formation method of the present invention as described above, a metal nitride film has low resistivity of 200 $\mu\Omega$-cm or less even with excellent step coverage and contains only a small amount of Cl. Also, the metal nitride film can be formed at a temperature of 500° C. or lower, and also a deposition speed, approximately 20 Å/cycle, is considerably higher than that in the metal nitride film formation method using ALE with a growth speed of 0.25 Å/cyle.

Accordingly, as opposed to when a metal nitride film is deposited at a temperature of 650° C. or higher in a conventional method, corrosion of metal wiring and high resistivity due to impurities (Cl) remaining in the metal nitride film can be solved, so that the present invention is applicable to a via contact which has a high aspect ratio and requires a low temperature. Also, since the present invention has a higher deposition speed than the metal nitride film formation method using ALE, it is suitable for mass production.

What is claimed is:

1. A method of forming a metal nitride film using chemical vapor deposition (CVD) in which a metal source and a nitrogen source are used as precursors, comprising the steps of:

(a) inserting a semiconductor substrate into a deposition chamber;

(b) admitting the metal source into the deposition chamber;

(c) chemisorbing a first portion of the metal source onto the substrate, and physisorbing a second portion of the metal source onto the substrate;

purging the metal source from the deposition chamber;

admitting the nitrogen source into the deposition chamber;

chemisorbing a portion of the nitrogen source onto the substrate, and physisorbing a second portion of the nitrogen source onto the substrate;

reacting the chemisorbed and physisorbed metal source with the chemisorbed and physisorbed nitrogen source to form a metal nitride film on the substrate; and, purging the nitrogen source from the deposition chamber.

2. The method of forming a metal nitride film as claimed in claim 1, wherein a titanium nitride film TiN is formed by using a material selected from the group consisting of TiCl$_4$, TiCl$_3$, TiI$_4$, TiBr$_2$, TiF$_4$, (C$_5$H$_5$)$_2$TiCl$_2$, ((CH$_3$)$_5$C$_5$)$_2$TiCl$_2$, C$_5$H$_5$TiCl$_3$, C$_9$H$_{10}$BCl$_3$N$_6$Ti, C$_9$H$_7$TiCl$_3$, (C$_5$(CH$_3$)$_5$)TiCl$_3$, TiCl$_4$(NH$_3$)$_2$, (Ch$_3$)$_5$C$_5$Ti(CH$_3$)$_3$, (Ti(N(CH$_2$CH$_3$)$_2$)$_4$) and (Ti(N(CH$_3$)$_2$)$_4$, as the metal source, and using NH$_3$ as the nitrogen source.

3. The method of forming a metal nitride film as claimed in claim 1, wherein a tantalum nitride film TaN is formed using a material selected from the group consisting of TaBr$_5$, TaCl$_5$, TaF$_5$, TaI$_5$, and (C$_5$CH$_3$)$_5$)TaCl$_4$, as the metal source, and using NH$_3$ as the nitrogen source.

4. The method of forming a metal nitride film as claimed in claim 1, wherein the step of purging the deposition chamber includes admitting a purge gas to the deposition chamber, and wherein the purge gas is Ar or N$_2$.

5. The method of forming a metal nitride film as claimed in claim 1, wherein an atmospheric gas is continuously introduced into the deposition chamber during the steps (a) through (e), to maintain a constant pressure in the deposition chamber.

6. The method of forming a metal nitride film as claimed in claim 5, wherein the atmospheric gas is at least one selected from the group consisting of Ar, He and N$_2$.

7. The method of forming a metal nitride film as claimed in claim 1, wherein the metal source or nitrogen source is mixed with a carrier gas.

8. The method of forming a metal nitride film as claimed in claim 7, wherein the carrier gas is Ar or N$_2$.

9. The method of forming a metal nitride film as claimed in claim 1, wherein the thickness of the metal nitride film to be deposited on the semiconductor substrate is controlled by repeating the steps (b) through (e).

10. A method of forming a metal contact of a semiconductor device, comprising the steps of:

(a) forming a first metal layer on a semiconductor substrate;

(b) depositing an interlayer insulative film on the first metal layer;

(c) forming a contact hole by etching the interlayer insulative film until the first metal layer is exposed;

(d) introducing a metal source into a deposition chamber and chemisorbing a first portion thereof to the resultant structure of the step (c) and physisorbing a second portion to the resultant structure of step (c);

(e) purging the unadsorbed metal source from the deposition chamber;

(f) introducing a nitrogen source into the deposition chamber, and reacting at least a potion thereof with the portions of the metal source chemisorbed and physisorbed on the structure of the step (c), to form a metal nitride film, being a barrier metal layer, on the exposed first metal layer and the contact hole;

(g) purging the unreacted nitrogen source from the deposition chamber;

(h) forming a metal plug on the resultant structure of step (g);

(I) exposing the interlayer insulative film by blanket etching the metal plug; and (j) forming a second metal layer on the resultant structure of step (I).

11. The method of forming a metal contact of a semiconductor device as claimed in claim 10, wherein a titanium nitride film TiN as the barrier metal layer is formed by using a material selected from the group consisting of TiCl$_4$, TiCl$_3$, TiI$_4$, TiBr$_2$, TiF$_4$, (C$_5$H$_5$)$_2$TiCl$_2$, ((CH$_3$)$_5$C$_5$)$_2$TiCl$_2$, C$_5$H$_5$TiCl$_3$, C$_9$H$_{10}$BCl$_3$N$_6$Ti, C$_9$H$_7$TiCl$_3$, (C$_5$(CH$_3$)$_5$)TiCl$_3$, TiCl$_4$(NH$_3$)$_2$, (CH$_3$)$_5$C$_5$Ti(CH$_3$)$_3$, Ti(N(CH$_2$CH$_3$)$_2$)$_4$) and (Ti(N(CH$_3$)$_2$)$_4$, as the metal source, and using NH3 as the nitrogen source.

12. The method of forming a metal contact of a semiconductor device as claimed in claim 10, wherein a tantalum nitride film TaN as the barrier metal layer is formed using a material selected from the group consisting of TaBr$_5$, TaCl$_5$, TaF$_5$, TaI$_5$, and (C$_5$(CH$_3$)$_5$) TaCl$_4$, as the metal source, and using NH$_3$ as the nitrogen source.

13. The method of forming a metal contact of a semiconductor device as claimed in claim 10, wherein the steps of purging the deposition chamber include admitting a purge gas to the deposition chamber, and wherein the purge gas is Ar or $N_2$.

14. The method of forming a metal contact of a semiconductor device as claimed in claim 10, wherein an atmospheric gas, being at least one selected from the group consisting of Ar, He and $N_2$, is continuously introduced into the deposition chamber during the steps (d) through (g), to maintain a constant pressure in the deposition chamber.

15. The method of forming a metal contact of a semiconductor device as claimed in claim 10, wherein the thickness of the barrier metal layer to be deposited on the first metal layer and the contact hole is controlled by repeating the steps (d) through (g).

16. A method of forming a metal contact of a semiconductor device, comprising the steps of:

(a) depositing an interlayer insulative film on a substrate;

(b) forming a contact hole by etching the interlayer insulative film until the substrate is exposed;

(c) introducing a metal source into a deposition chamber and chemisorbing a first portion thereof and physisorbing a second portion thereof to the resultant structure of a step (b);

(d) purging the unadsorbed metal source from the deposition chamber;

(e) introducing a nitrogen source into the deposition chamber, and reacting at least a portion thereof with the metal source physisorbed and chemisorbed on the resultant structure of the step (b) to form a metal nitride film, being a barrier metal layer, on the exposed substrate and the contact hole;

(f) purging the unreacted nitrogen source from the deposition chamber.

17. The method of forming a metal contact of a semiconductor device as claimed in claim 16, wherein the substrate is formed of a metal layer.

* * * * *

UNITED STATES PATENT AND TRADEMARK OFFICE
CERTIFICATE OF CORRECTION

PATENT NO.   : 6,197,683 B1
DATED        : March 6, 2002
INVENTOR(S)  : Kang et al.

It is certified that error appears in the above-identified patent and that said Letters Patent is hereby corrected as shown below:

Column 2,
Line 11, "675° C. required" should read -- 675° C. is required --;
Line 21, "TICl4" should read -- TiC14 --;

Column 3,
Line 11, "Til4" should read -- TiI4 --;
Line 27, "Tal5" should read -- TaI5 --;

Column 4,
Line 10,"Til4" should read -- TiI4 --;
Line 16, "Tal5" should read -- TaI5 --;

Column 6,
Line 57, "TICI4" should read -- TiCl4 --;

Column 7,
Line 46, "1-2Torr" should read -- 1-20 Torr --;

Column 8,
Line 52, "time of material" should read -- time of metal --;

Column 10,
Line 63, "Til4" should read -- TiI4 --;

Column 11,
Line 1, "Tal5" should read -- TaI5 --;
Line 44, "purging" should read -- (d) purging --;
Line 45, "admitting" should read -- (e) admitting --;
Line 47, "chemisorbing" should read -- (f) chemisorbing --;
Line 51, "reacting" should read -- (g) reacting —;
Line 54, "purging" should read -- (h) purging --;
Line 58 "Til4" should read -- TiI4 --;
Line 66, "Tal5" should read -- TaI5 --;

UNITED STATES PATENT AND TRADEMARK OFFICE
CERTIFICATE OF CORRECTION

PATENT NO.    : 6,197,683 B1
DATED         : March 6, 2002
INVENTOR(S)   : Kang et al.

It is certified that error appears in the above-identified patent and that said Letters Patent is hereby corrected as shown below:

Column 12,
Line 55, "Til4" should read -- TiI4 --;
Line 64, "Tal5" should read -- TaI5 --.

Signed and Sealed this

Twenty-fifth Day of February, 2003

JAMES E. ROGAN
*Director of the United States Patent and Trademark Office*